US010700220B2

(12) United States Patent
Mazzillo et al.

(10) Patent No.: US 10,700,220 B2
(45) Date of Patent: *Jun. 30, 2020

(54) ARRAY OF GEIGER-MODE AVALANCHE PHOTODIODES FOR DETECTING INFRARED RADIATION

(71) Applicant: STMICROELECTRONICS S.R.L., Agrate Brianza (IT)

(72) Inventors: Massimo Cataldo Mazzillo, Corato (IT); Piero Fallica, Catania (IT); Salvatore Lombardo, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/228,483

(22) Filed: Dec. 20, 2018

(65) Prior Publication Data
US 2019/0148568 A1    May 16, 2019

Related U.S. Application Data

(63) Continuation of application No. 15/868,929, filed on Jan. 11, 2018, now Pat. No. 10,205,036, which is a
(Continued)

(30) Foreign Application Priority Data

Jul. 27, 2016  (IT) .................. 102016000079027

(51) Int. Cl.
*H01L 31/107* (2006.01)
*H01L 31/0216* (2014.01)
(Continued)

(52) U.S. Cl.
CPC ......... *H01L 31/02164* (2013.01); *G01J 1/44* (2013.01); *H01L 27/1446* (2013.01);
(Continued)

(58) Field of Classification Search
CPC ............ H01L 31/107; H01L 31/02164; H01L 31/02165
See application file for complete search history.

(56) References Cited

U.S. PATENT DOCUMENTS 8,766,164 B2   7/2014  Sanfilippo et al.
8,853,641 B2  10/2014  Mazzillo
(Continued)

FOREIGN PATENT DOCUMENTS

CN         101258577 A    9/2008

OTHER PUBLICATIONS

Akil et al., "A Multimechanism Model for Photon Generation by Silicon Junctions in Avalanche Breakdown," *IEEE Transactions on Electron Devices* 46(5):1022-1028, 1999.
(Continued)

*Primary Examiner* — Mark V Prenty
(74) *Attorney, Agent, or Firm* — Seed Intellectual Property Law Group LLP (57) ABSTRACT

An array of Geiger-mode avalanche photodiodes is formed in a die and includes: an internal dielectric structure, arranged on the die; and an external dielectric region arranged on the internal dielectric structure. The external dielectric region is formed by an external material that absorbs radiation having a wavelength that falls in a stop-band with low wavelength and transmits radiation having a wavelength that falls in a pass-band with high wavelength, at least part of the pass-band including wavelengths in the infrared. The internal dielectric structure is formed by one or more internal materials that substantially transmit radiation having a wavelength that falls in the stop-band and in the pass-band and have refractive indices that fall in an interval having an amplitude of 0.4. In the stop-band and in the
(Continued)

pass-band the external dielectric region has a refractive index with the real part that falls in the above interval.

20 Claims, 7 Drawing Sheets

Related U.S. Application Data continuation of application No. 15/449,655, filed on Mar. 3, 2017, now Pat. No. 9,899,544.

(51) Int. Cl.
*H01L 27/146* (2006.01)
*G01J 1/44* (2006.01)
*H01L 27/144* (2006.01)
*H01L 31/02* (2006.01)

(52) U.S. Cl.
CPC .... *H01L 27/1462* (2013.01); *H01L 27/14625* (2013.01); *H01L 27/14649* (2013.01); *H01L 31/02027* (2013.01); *H01L 31/107* (2013.01); *G01J 2001/4466* (2013.01); *H01L 27/1463* (2013.01)

(56) References Cited

U.S. PATENT DOCUMENTS

| | | | |
|---|---|---|---|
| 9,395,182 | B1 | 7/2016 | Yuan et al. |
| 9,899,544 | B1* | 2/2018 | Mazzillo ............ G01J 1/44 |
| 10,082,576 | B2 | 9/2018 | Lee et al. |
| 10,205,036 | B2* | 2/2019 | Mazzillo ............ G01J 1/44 |
| 2011/0169117 | A1 | 7/2011 | McIntosh et al. |
| 2011/0241149 | A1 | 10/2011 | Mazzillo et al. |
| 2012/0256284 | A1 | 10/2012 | Yukawa et al. |
| 2013/0341694 | A1 | 12/2013 | Maekawa et al. |

OTHER PUBLICATIONS

EO Edmund Optics Worldwide, 5"×7", Optical Cast Plastic IR Longpass Filter, URL=https://www.edmundoptics.com/optics/optical-filters/long pass-edge-filters/5quot-x-7quot-optical-cast-plastic-ir-longpass-filter/, download May 17, 2017.
Feuerbaum, "Development of Calibration Methods for a Photon Emission Microscope to Analyse Light Emitted from Semiconductor Detectors," *The MPI Semiconductor Laboratory and the Physik-Department Technische Universität München*, 2008, 85 pages
"Large area, enhanced near IR sensitivity, using a MEMS technology," *Hamamatsu IR-enhanced Si Pin photodiodes S11499 series*, 2016, 3 pages.
"NIR (Near Infrared:1.4μm/1.7μm) Photomultiplier Tubes R5509-42/R5509-73 and Exclusive Coolers," *Hamamatsu Photonics K.K., Electron Tube Center*, 2003, 4 pages.
LeBoeuf, "Optical heart-rate measurement's top 5 challenges," *EDN Network*, 2015, 6 pages.
Mirzoyan, "SiPM: How to Make it an ideal LLL Sensor," *Max-Planck-Institute for Physics (Werner-Heisenberg-Institute)*, 2008, 62 pages.
Scholkmann et al., "End-tidal CO2: An important parameter for a correct interpretation in functional brain studies using speech tasks," *NeuroImage* 66: 71-79, 2012.
"Silicon Avalanche Photodiode SAE-Series (NIR-Enhanced)," *Laser Components*, 2005, 5 pages.
"Silicon NPN Phototransistor," *Vishay Semiconductors BPV11*, 2013, 5 pages.

* cited by examiner

ARRAY OF GEIGER-MODE AVALANCHE PHOTODIODES FOR DETECTING INFRARED RADIATION

BACKGROUND

Technical Field

The present disclosure relates to an array of Geiger-mode photodiodes for detecting infrared radiation.

Description of the Related Art

As is known, today sensors for detecting infrared radiation (i.e., radiation with a wavelength of between 700 nm and 2000 nm) find widespread use not only in the sector of telecommunications, but also, for example, in the sector of so-called 3D imaging, as well as, once again by way of example, in the sector of thermography and plethysmography.

Currently used for detection of infrared radiation are, among other things, semiconductor sensors operating in the linear region, avalanche photodetectors, phototransistors, and vacuum photomultiplier tubes. Instead, the so-called arrays of Geiger-mode avalanche photodiodes (GMAPs) are relatively little used in the field of detection of infrared radiation, since, even though they guarantee a good sensitivity in regard to infrared radiation, they are subject to dark currents that increase considerably as the reverse biasing voltage increases, with consequent reduction of the signal-to-noise ratio.

In greater detail, a Geiger-mode avalanche photodiode, also known as single-photon avalanche diode (SPAD), is formed by an avalanche photodiode (APD), and thus comprises a junction of semiconductor material, which has a breakdown voltage $V_B$ and is biased, in use, with a reverse biasing voltage $V_A$ higher in modulus than the breakdown voltage $V_B$, which, as is known, depends upon the semiconductor material and upon the doping level of the least doped region of the junction itself. In this way, the junction has a particularly extensive depleted region, present inside which is a non-negligible electrical field. Thus, generation of a single electron-hole pair, following upon absorption of a photon incident on the SPAD, may be sufficient to trigger an ionization process. This ionization process in turn causes an avalanche multiplication of the carriers, with gains of around $10^6$ and consequent generation in short times (hundreds of picoseconds) of the avalanche current, or more precisely of a pulse of the avalanche current.

The avalanche current may be appropriately collected, typically by means of external circuitry connected to the junction, and represents an output signal of the SPAD, which will be referred to also as output current. In practice, for each photon absorbed, a pulse of the output current of the SPAD is generated.

The fact that the reverse biasing voltage $V_A$ is higher than the breakdown voltage $V_B$ causes the avalanche ionization process, once triggered, to be self-sustaining. Consequently, once the ionization process is triggered, the SPAD is no longer able to detect photons. To be able to detect also the subsequent photons, the avalanche ionization process must be stopped, by lowering, for a period of time known as "hold-off time", the effective voltage across the junction. For this purpose, it is known to use of so-called quenching circuits, which may be either of an active type or of a passive type. For example, in the case of passive quenching, the quenching circuits may be formed by integrated resistors.

This being said, an array of SPADs is formed by a planar array of SPADs grown on one and the same substrate. The anode and cathode electrodes of the SPADs may be respectively connected together so that the SPADs may be biased at one and same reverse biasing voltage $V_A$, in which case the array forms a so-called silicon photomultiplier (SiPM). Further, in the case of a SiPM, the SPADs are provided with respective quenching resistors (for example, of a vertical type), which are integrated in the SPADs and are decoupled from one another and independent. In addition, the avalanche currents generated within the SPADs are multiplexed together for generating an output signal of the SiPM equal to the summation of the output signals of the SPADs, the output signal being thus proportional to the number of photons that impinge upon the SiPM.

In general, any array of SPADs is affected by the phenomenon of optical crosstalk.

In detail, given any SPAD of an array, the corresponding operation is affected by the photons generated by electroluminescence during avalanche multiplication processes triggered in surrounding SPADs.

In greater detail, it is known that the SPADs operating above the breakdown voltage emit in an isotropic way secondary photons, on account of various mechanisms such as, for example, (direct and indirect) interband recombinations and direct intraband electronic transitions. The secondary photons are generally emitted within a wavelength range comprised between 400 nm and 2 μm, with a likelihood of emission that depends upon the reverse biasing voltage $V_A$ applied.

The secondary photons may propagate and be subsequently absorbed in the junctions of SPADs different from the SPADs in which they have been generated, triggering avalanche events that cause the aforesaid optical crosstalk.

This being said, assuming, for example, an array of SPADs biased with one and the same reverse biasing voltage $V_A$, as the overvoltage $OV=-(V_A-V_B)$ increases, there occurs an increase in the gain and in the detection efficiency of the array. However, there further occurs, as mentioned previously, an undesirable increase in the dark current, which is triggered by spurious events such as optical crosstalk and afterpulsing. For this reason, in the context of detection of infrared radiation there are used at most arrays biased with low reverse voltages (typically, such that the overvoltage OV will be around 2 or 3 V). Further, the arrays used in the context of detection of infrared radiation have limited sensitive areas (typically, in the region of a few square millimeters) since the dark current increases as the sensitive area increases.

BRIEF SUMMARY

At least one embodiment of the present disclosure is an array of Geiger-mode avalanche photodiodes that enables the drawbacks of the known art to be overcome at least in part.

According to the disclosure, an array of Geiger-mode avalanche photodiodes is provided as defined in the annexed claims.

BRIEF DESCRIPTION OF THE SEVERAL VIEWS OF THE DRAWINGS

For a better understanding of the disclosure, embodiments thereof are now described, purely by way of non-limiting example and with reference to the attached drawings, wherein:

FIG. 3b is a schematic perspective view from beneath of the array of photodiodes shown in FIG. 3a;

DETAILED DESCRIPTION

Figure 1:
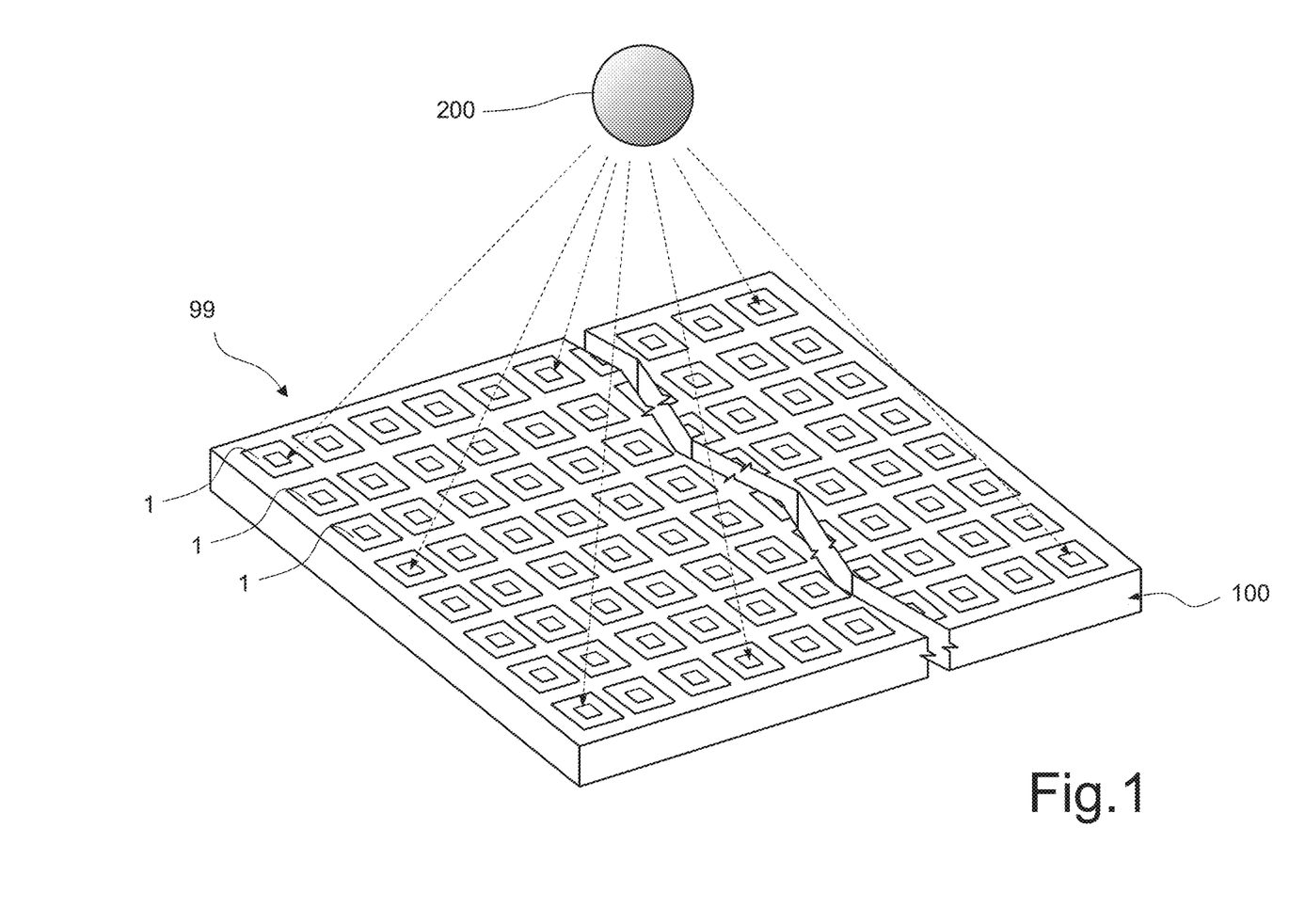
FIG. 1 is a schematic perspective view of an array of photodiodes.
Figure 2:
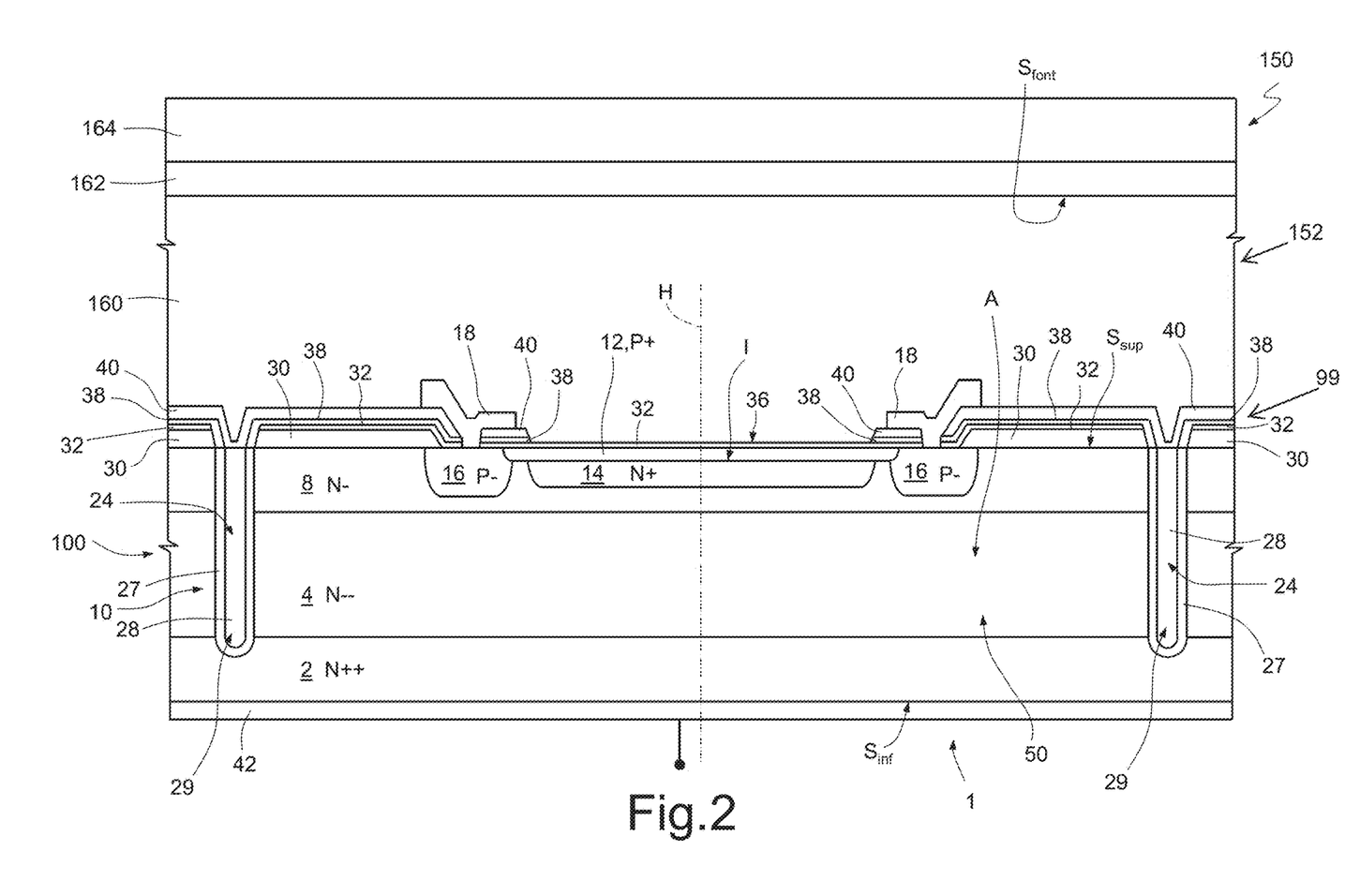
FIG. 2 is a schematic cross-sectional view of a photodiode of an array of photodiodes.

FIG. 1 shows an embodiment of an array 99 of SPADs 1, which are arranged in planar fashion and are illuminated by a light source 200. The array 99 may comprise any number of SPADs 1, according to the need. Further, the array 99 is integrated in a die 100, which, as shown in FIG. 2 (which is not in scale), comprises a semiconductor body 10 made, for example, of silicon.

Purely by way of example, the semiconductor body 10 comprises a substrate 2, which is delimited at the bottom and at the top by a bottom surface $S_{inf}$ and a top surface $S_{sup}$, respectively. Further, the semiconductor body 10 comprises a first epitaxial layer 4 and a second epitaxial layer 8.

The substrate 2 is of an N++ type, has a thickness, for example, of between 300 μm and 500 μm and has a doping level, for example, of between $1·10^{19}$ cm$^{-3}$ and $5·10^{20}$ cm$^{-3}$. Further, the substrate 2 forms the aforementioned bottom surface $S_{inf}$.

The first epitaxial layer 4 is of an N-- type, has a thickness, for example, of between 5 μm and 10 μm and overlies the substrate 2, in direct contact therewith. Further, the first epitaxial layer 4 has a doping level, for example, of between $1·10^{14}$ cm$^{-3}$ and $5·10^{14}$ cm$^{-3}$.

The second epitaxial layer 8 is of an N- type, has a thickness, for example, of between 2 μm and 5 μm and overlies the first epitaxial layer 4, in direct contact therewith. Further, the second epitaxial layer 8 forms the aforementioned top surface $S_{sup}$. The doping level of the second epitaxial layer 8 is, for example, of between $5·10^{15}$ cm$^{-3}$ and $1·10^{16}$ cm$^{-3}$.

The SPADs 1 are, for example, the same as one another. Thus, in what follows just one of the SPADs 1, included in a packaged optoelectronic device 150 shown in FIG. 2, is described by way of example.

In detail, the SPAD 1 comprises an anode region 12, which is of a P+ type and has, in top plan view, a circular or polygonal (for example, quadrangular) shape. The anode region 12 extends in the second epitaxial layer 8 from the top surface $S_{sup}$. In particular, the anode region 12 has a thickness, for example, of between 0.1 μm and 0.5 μm. Further, the anode region 12 has a doping level, for example, of between $1·10^{19}$ cm$^{-3}$ and $1·10^{20}$ cm$^{-3}$.

The SPAD 1 further comprises an enriched region 14 of an N+ type, which extends in the second epitaxial layer 8, underneath, and in direct contact with, the anode region 12. In top plan view, the enriched region 14 has a circular or polygonal (for example, quadrangular) shape. Further, the enriched region 14 has a thickness of, for example, 1 μm and a doping level, for example, of between $1·10^{16}$ cm$^{-3}$ and $5·10^{16}$ cm$^{-3}$.

For practical purposes, the anode region 12 and the enriched region 14 form a first PN junction designed to receive photons and to generate the avalanche current, as described in detail hereinafter. In other words, the anode region 12 and the enriched region 14 are in contact with one another along an interface surface I.

The enriched region 14 and the second epitaxial layer 8 have, instead, the purpose of confining a high electrical field in the proximity of the first PN junction, reducing the breakdown voltage $V_B$ of the junction itself.

The SPAD 1 further comprises a guard ring 16 of a circular shape, of a P- type and with a doping level of between $1·10^{16}$ cm$^{-3}$ and $3·10^{16}$ cm$^{-3}$. In particular, the guard ring 16 extends in the second epitaxial layer 8 from the top surface $S_{sup}$. Further, the guard ring 16 surrounds the anode region 12, contacting a peripheral portion of the latter. In addition, the guard ring 16 has a thickness, for example, of between 1 μm and 3 μm.

The guard ring 16 forms a second PN junction with the second epitaxial layer 8 for preventing edge breakdown of the anode region 12. Further, the guard ring 16 is in direct electrical contact with an anode metallization 18, which is arranged over the top surface $S_{sup}$ and enables biasing of the first PN junction. In particular, in use, it is possible to apply to the anode metallization 18 a reverse biasing voltage $V_A$ higher, in modulus, than the breakdown voltage $V_B$ of the first PN junction. Albeit not shown in FIG. 2, the anode metallization 18 is connected in a way in itself known to conductive pads 19 (shown in FIG. 3a) present on the die 100, which will be referred to in what follows as the die pads 19.

The SPAD 1 further comprises a lateral insulation region 24, which surrounds, at a distance, the guard ring 16 and performs the function of preventing secondary photons generated in the SPAD 1 from being absorbed by adjacent SPADs. The lateral insulation region 24 is formed within a corresponding trench 29 having an annular shape, in top plan view.

In detail, the lateral insulation region 24 extends within the semiconductor body 10, starting from the top surface $S_{sup}$. In top plan view, the lateral insulation region 24 has a circular or polygonal shape and delimits laterally the active area A of the photodiode 1.

In greater detail, the lateral insulation region 24 comprises a channel-stopper region 27, arranged externally, and a barrier region 28, arranged internally.

The channel-stopper region 27 is made of dielectric material (for example, oxide) and is arranged in direct contact with the semiconductor body 10.

The barrier region 28 is made of polysilicon and is surrounded by the channel-stopper region 27, with which it is in direct contact. Further, the barrier region 28 is in direct contact with a dielectric layer described in detail hereinafter and referred to as the fourth dielectric layer 40.

In greater detail, the polysilicon that forms the barrier region 28 may have a doping either of an N type or of a P type and has a doping level, for example, of between $1·10^{19}$ cm$^{-3}$ and $5·10^{20}$ cm$^{-3}$.

In yet greater detail, the lateral insulation region 24 extends in the semiconductor body 10 starting from the top surface $S_{sup}$ for traversing the first and second epitaxial layers 4, 8, as well as to extend in a top portion of the substrate 2.

Purely by way of example, the barrier region 28 has a width of, for instance, 1 μm.

The array 99 further comprises a first dielectric layer 30, a second dielectric layer 32, and a third dielectric layer 38, in addition to the aforementioned fourth dielectric layer 40, which are now described with reference to the corresponding arrangements within the SPAD 1.

In detail, the first dielectric layer 30 is formed, for example, by thermal oxide and extends over a portion of the top surface $S_{sup}$ laterally staggered with respect to the anode region 12 for leaving the anode region 12 and a portion of the guard ring 16 that contacts the anode region 12 exposed.

The second dielectric layer 32 is formed, for example, by TEOS oxide and extends over the first dielectric layer 30, with which it is in direct contact, as well as over the anode region 12, with which it is in direct contact. Further, the second dielectric layer 32 extends also over the aforementioned portion of the guard ring 16 that contacts the anode region 12.

The second dielectric layer 32 functions as passivation region and may be sized for forming an anti-reflection layer that increases optical transmission in the infrared.

The third dielectric layer 38 is formed, for example, by TEOS oxide, forms a single layer with the channel-stopper region 27, and extends over the second dielectric layer 32, with which it is in direct contact, without, however, overlying a central portion of the anode region 12. In other words, the third dielectric layer 38 is laterally staggered with respect to the anode region 12 and to the underlying enriched region 14.

The fourth dielectric layer 40 is formed, for example, by TEOS oxide and extends over the third dielectric layer 38, with which it is in direct contact. Further, the fourth dielectric layer 40 extends for closing the lateral insulation region 24 at the top. In particular, the fourth dielectric layer 40 extends as far as into contact with the barrier region 28.

The anode metallization 18 traverses the second, third, and fourth dielectric layers 32, 38, 40 for contacting the guard ring 16, as mentioned previously.

A cathode metallization 42, made of metal material, extends underneath the bottom surface $S_{inf}$ of the substrate 2, with which it is in direct contact. In this way, given the arrangement of the anode metallization 18, the avalanche current generated by the SPAD 1 flows in the direction of an axis H perpendicular to the bottom surface $S_{inf}$ and to the top surface $S_{sup}$.

For practical purposes, the enriched region 14, the substrate 2, and the first and second epitaxial layers 4, 8 form a cathode region of the SPAD 1. Further, within the substrate 2, the voltage drop due to passage of the avalanche current is negligible, on account of the low resistivity of the substrate 2.

In addition, albeit not shown, the anode metallization 18 contacts a corresponding polysilicon region (not shown), which functions as quenching resistor. The polysilicon regions (not shown) of the SPADs 1 are connected to a shared metal bus (not shown).

Since the lateral insulation region 24 extends as far as the substrate 2, and given the low resistivity of the substrate 2, turning-on of one SPAR 1 does not alter, to a first approximation, biasing of the adjacent SPADs 1. Consequently, the array 99 of SPADs 1 forms a semiconductor photomultiplier, namely a SiPM, in which the SPADs 1 may work substantially in the same operating conditions. In this connection, albeit not shown, the anode and cathode metallizations of the SPADs 1 of the array 99 are configured so that they may all be connected to a single voltage generator, which supplies the reverse biasing voltage $V_A$.

Figure 3A:
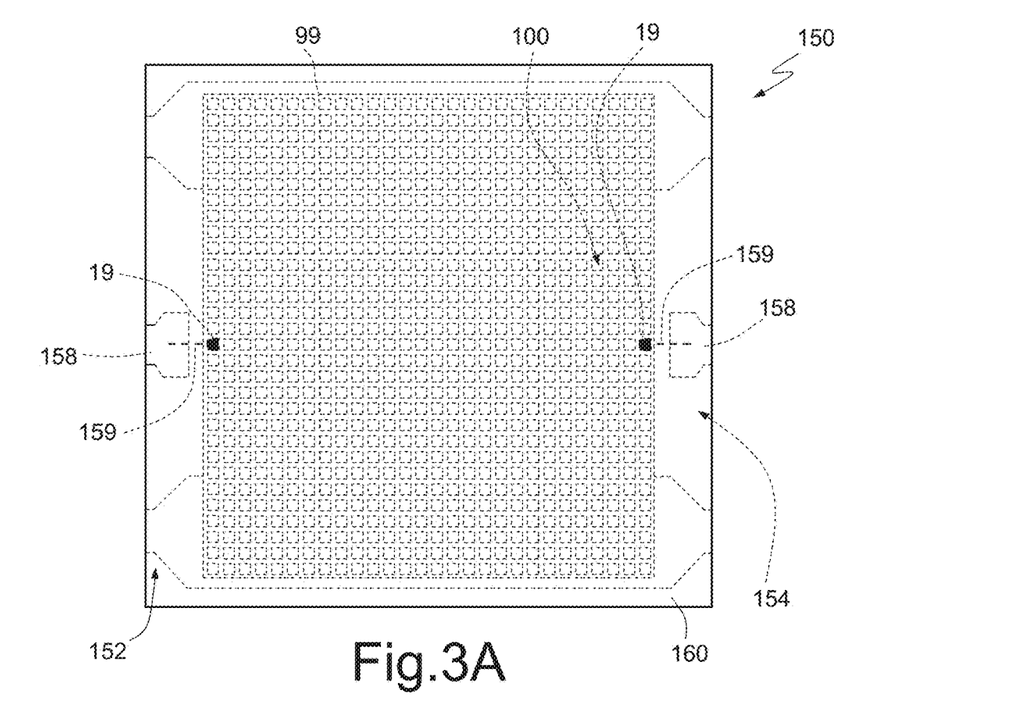
FIG. 3a is a schematic perspective view from above of an array of photodiodes with portions removed.
Figure 3B:
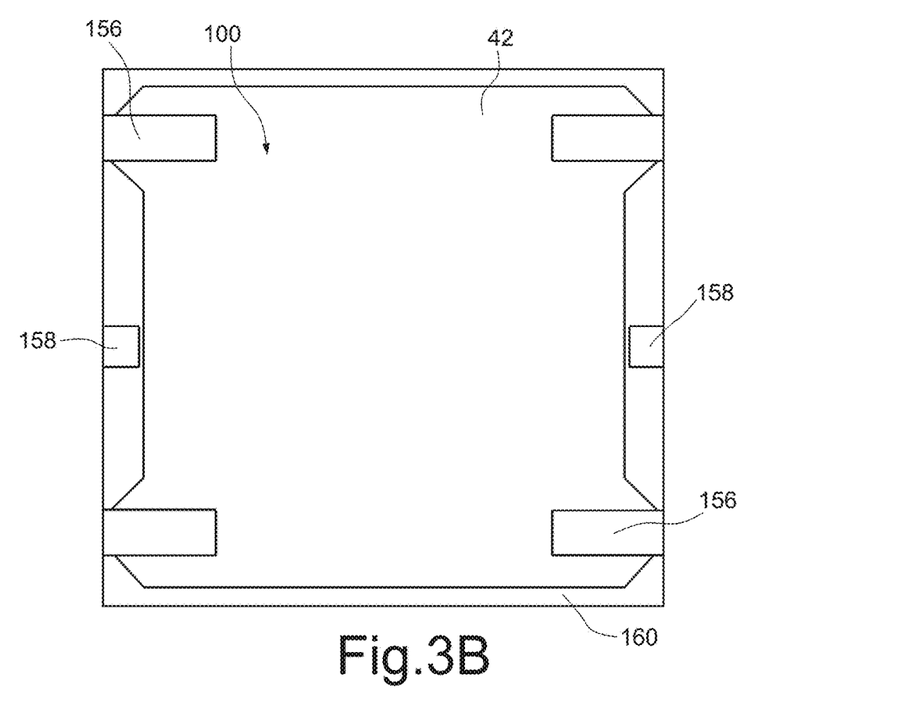

The optoelectronic device 150 also includes packaging 152, such as of a surface mount device (SMD) type, as shown in FIGS. 2, 3a, 3b.

The packaging 152 comprises a lead frame 154 made of conductive material (for example, gold), which in turn comprises one or more pads 156 that contact the cathode metallization 42, as shown in FIGS. 3a and 3b. These pads 156 form corresponding contact terminals of the packaged device 150, which are designed to enable biasing of the cathode metallization 42.

The lead frame 154 further comprises one or more pads 158, each of which is connected to a corresponding die pad 19 by means of a corresponding wire bonding 159. The pads 158 may thus be used for biasing the anode metallizations 18 of the SPADs 1.

The packaging 152 further comprises a first packaging layer 160 (FIGS. 2, 3a, 3b), which surrounds the die 100 laterally and at the top.

In greater detail, the first packaging layer 160 is formed by an epoxy resin, which is substantially transparent to radiation having a wavelength comprised in the interval [400 nm, 1600 nm]. For example, the portion of first packaging layer 160 that overlies the die 100 transmits at least 90% of the incident radiation having a wavelength comprised in the interval [400 nm, 1600 nm].

Further, the first packaging layer 160 overlies the SPADs 1 and thus extends in contact with the fourth dielectric layer 40 and with the second dielectric layer 32 (where exposed, i.e., over the anode region 12), as shown in FIG. 2. The first packaging layer 160 is delimited at the top by a front surface $S_{front}$.

The packaging 152 further comprises a second packaging layer 162 and a third packaging layer 164 (visible in FIG. 2, but not shown, for simplicity, in FIGS. 3a and 3b).

In detail, the second packaging layer 162 is arranged on the front surface $S_{front}$, in contact with the first packaging layer 160. The third packaging layer 164 is arranged above the second packaging layer 162, with which it is in direct contact.

In greater detail, the second packaging layer 162 is formed, for example, by an optical glue (for example, a silicone glue) and is designed to glue the third packaging layer 164 to the first packaging layer 160. Also the optical glue is substantially transparent to radiation having a wavelength comprised in the interval [400 nm, 1600 nm]. For example, the second packaging layer 162 transmits at least 90% of the incident radiation having a wavelength comprised in the interval [400 nm, 1600 nm].

The third packaging layer 164 is made of a homogeneous material such that the third packaging layer 164 blocks, by absorbing it, radiation having a wavelength lower than $\lambda_{filter}$=700 nm, whereas it is to a first approximation transparent to radiation having a wavelength higher than $\lambda_{filter}$. For example, the third packaging layer 164 may transmit at least 90% of the incident radiation having a wavelength higher than $\lambda_{filter}$ and may absorb at least 90% of the radiation having a wavelength lower than $\lambda_{filter}-\Delta$, where, for example, $\Delta$=100 nm. In other words, the third packaging layer 164 functions as single-band high-pass optical filter.

In greater detail, the third packaging layer 164 is formed, for example, by allyl diglycol carbonate or polyallyl diglycol carbonate (also known as CR39), in which case it functions as polymeric-plastic filter, with a response of a high-pass type.

In yet greater detail, it is possible to define a wavelength $\lambda_{cutoff}$=1240/$E_g$, where $E_g$ (expressed in electronvolts) is the so-called energy gap of the semiconductor material that forms the semiconductor body 10; for example, in the case of silicon, $\lambda_{cutoff}$≈1100 nm. This being said, we have $\lambda_{cutoff} > \lambda_{filter}$. Further, the array 99 is designed to detect with particular efficiency infrared radiation having a wavelength comprised in the interval $[\lambda_{cutoff}, \lambda_{filter}]$.

From an optical standpoint, each of the first, second, and third packaging layers 160, 162, 164 is homogeneous. Further, the first, second, and third packaging layers 160, 162, 164 have substantially one and the same refractive index, for example of approximately 1.5. For instance, the refractive indices of the first, second, and third packaging layers 160, 162, 164 are comprised in an interval $[n_{inf}, n_{sup}]$ having a width, for example, not greater than 0.4, preferably than 0.2.

More precisely, it is assumed that in the interval [400 nm, 1600 nm] the refractive indices of the first and second packaging layers 160, 162 have negligible imaginary components that are comprised in the interval $[n_{inf}, n_{sup}]$. It is further assumed that in the interval [400 nm, 1600 nm] the refractive index of the third packaging layer 164 has a real part comprised in the interval $[n_{inf}, n_{sup}]$. Further, the refractive index of the third packaging layer 164 has a non-negligible imaginary component for $\lambda < \lambda_{filter} - \Delta$.

Without any loss of generality, it is assumed that, in the interval [400 nm, 1600 nm], also the refractive index of the second dielectric layer 32 is substantially real and is comprised in the interval $[n_{inf}, n_{sup}]$.

From an optical standpoint, the structure formed by the first, second, and third packaging layers 160, 162, 164 may be considered equivalent to a substantially homogenous structure. Consequently, it may be assumed that at the interfaces present between the first, second, and third packaging layers 160, 162, 164 there occur no phenomena of reflection/refraction.

This being said, the presence of the structure formed by the first, second, and third packaging layers 160, 162, 164 does not modify the performance of the array 99 in detection of infrared radiation. Rather, this structure contributes to filtering environmental light having a wavelength different from the wavelengths of interest.

In addition, the presence of the structure formed by the first, second, and third packaging layers 160, 162, 164 enables improvement of the performance of the array 99 in terms of dark current, as explained hereinafter. In particular, in what follows reference is made to FIG. 4, where purely by way of example a portion of the array 99 is shown, which includes a first SPAD and a second SPAD adjacent to one another and designated, respectively, by 1A and 1B. For simplicity of representation, in FIG. 4 not all the references mentioned previously are shown.

Figure 4:
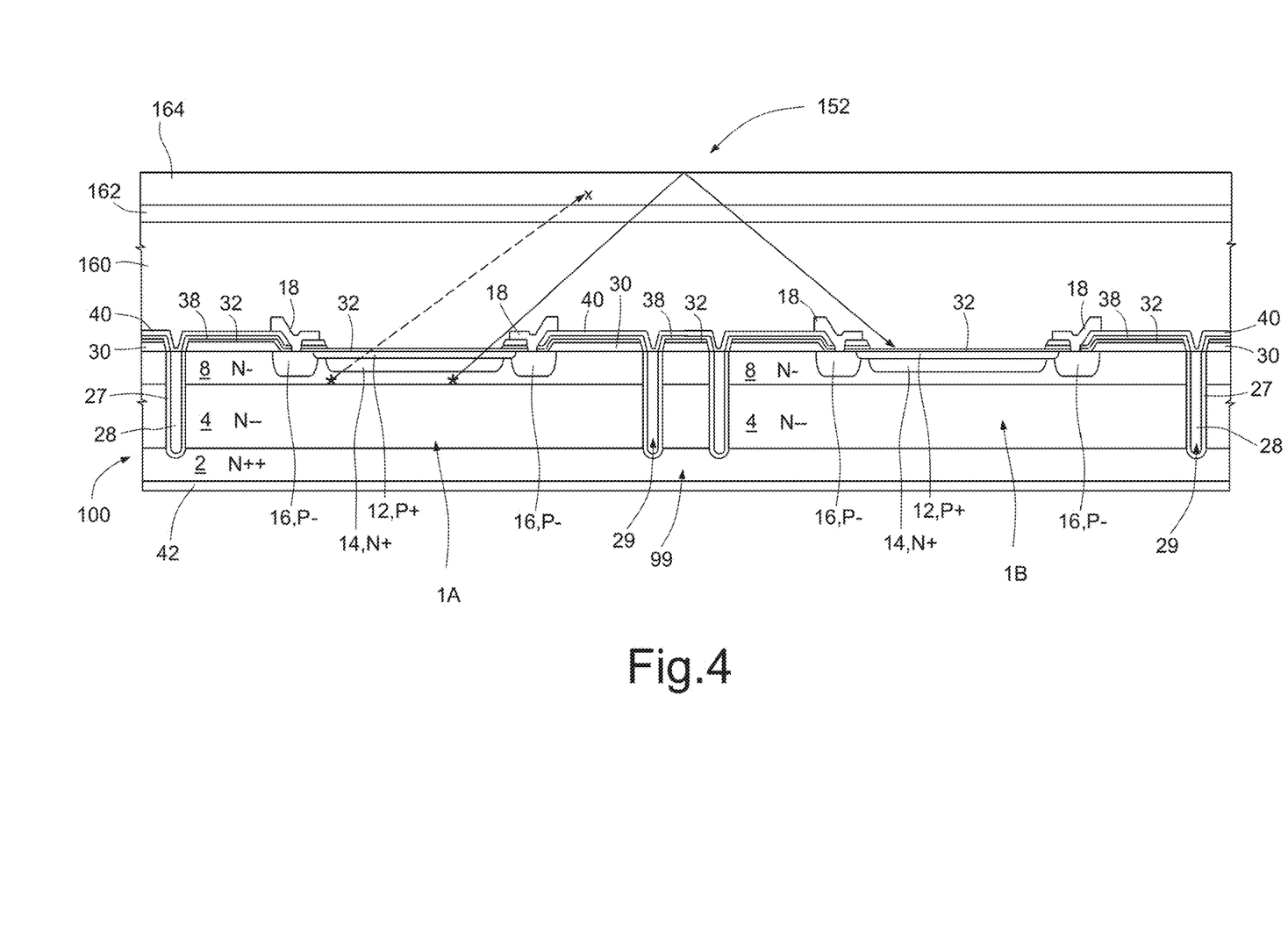
FIG. 4 is a schematic cross-sectional view of two adjacent photodiodes of an array of photodiodes.

In detail, it is assumed that the first SPAD 1A emits secondary photons (represented with a dashed line) having a first wavelength, for example, of between 400 nm and 600 nm, and secondary photons (represented with a solid line) having a second wavelength of between 700 nm and 1100 nm. It is further assumed that these secondary photons are directed towards the first, second, and third packaging layers 160, 162, 164 for not intercepting the lateral insulation region 24 of the first SPAD 1A. Consequently, in principle, these secondary photons could cause optical crosstalk in the second SPAD 1B. In particular, in principle the secondary photons having the first wavelength potentially represent the main cause of optical crosstalk in the second SPAD 1B, because, even though they are emitted in a smaller amount than the secondary photons having the second wavelength, they present a low likelihood of being re-absorbed before coming out of the semiconductor material that forms the first SPAD 1A, on account of the surface arrangement of the aforementioned first PN junction of the first SPAD 1A. Further, once again in principle, the secondary photons having the first wavelength have a greater likelihood of triggering avalanche events in the second SPAD 1B, since the SPADs of the array 99 have a high detection efficiency in the visible.

This being said, it may be assumed that the secondary photons having the first wavelength traverse the first and second packaging layers 160, 162 without undergoing either reflection or refraction, until they penetrate into the third packaging layer 164, where they are absorbed. Consequently, unlike what occurs in packagings of a traditional type, without (among other things) the second and third packaging layers 162, 164, the secondary photons having the first wavelength are unable to reach the second SPAD 1B.

As regards, instead, the secondary photons having the second wavelength, also these reach as far as the third packaging layer 164 without undergoing either reflection or refraction. Then, these photons traverse the third packaging layer 164 until they impinge upon the interface present between the third packaging layer 164 and the external environment, where they may be reflected. Consequently, at least part of the photons having the second wavelength may traverse again the second and first packaging layers 162, 160, until they penetrate into the semiconductor material of the second SPAD 1B. However, the photons that manage to penetrate into the semiconductor material of the second SPAD 1B have in any case a low likelihood of triggering spurious avalanche events on account of their high depth of penetration into the semiconductor material and of the relatively low detection efficiency of the SPADs at the second wavelength. For these reasons, the optical crosstalk between the SPADs of the array 99 is reduced, and consequently the array 99 is characterized by a reduced dark current even in the presence of high overvoltages, without the area of the array 99 itself being limited.

Incidentally, it should be noted how the possible use, instead of the third packaging layer 164, of an interferential infrared high-pass filter would cause a considerable increase in the dark current since the aforementioned secondary photons having the first wavelength could be reflected towards the second SPAD 1B.

Figure 5:
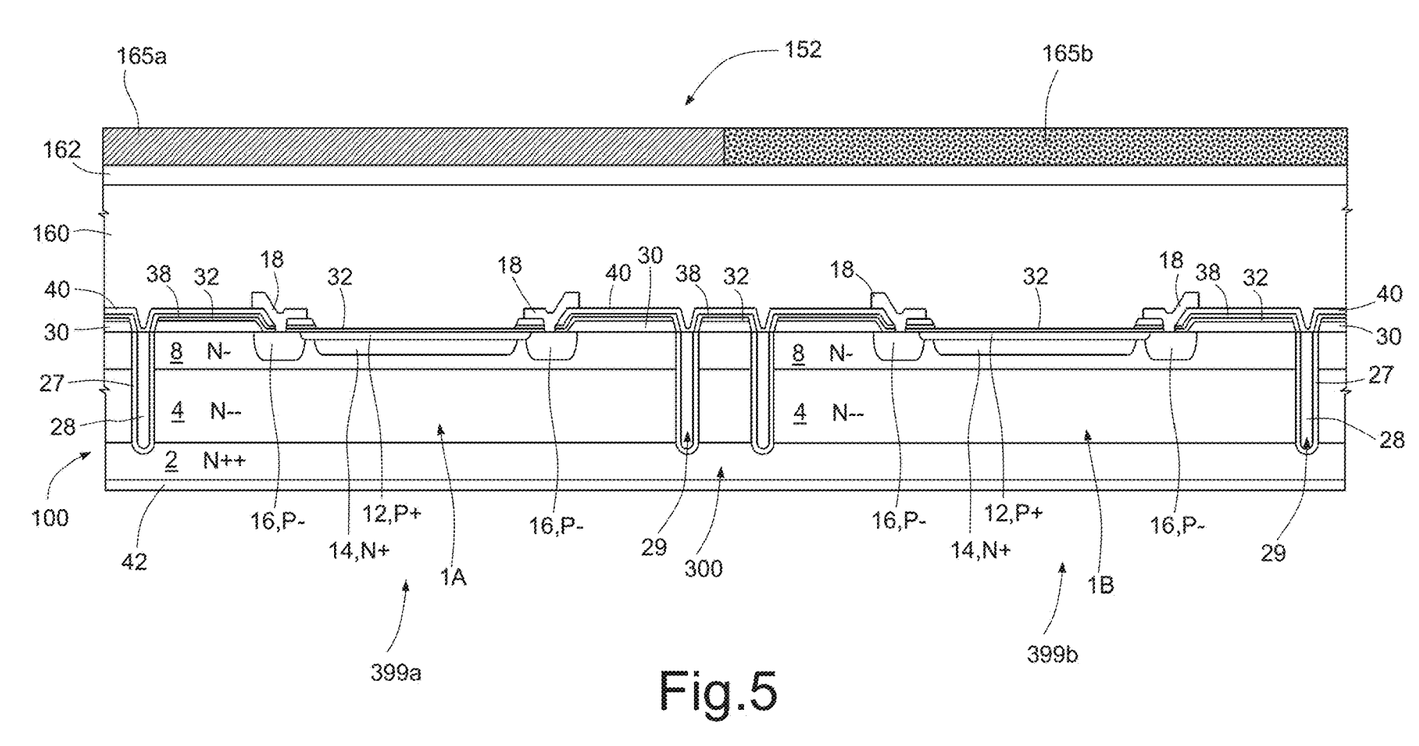
FIG. 5 is a schematic cross-sectional view of two photodiodes belonging to two respective adjacent arrays of an array of arrays of photodiodes.

FIG. 5 shows an array 300 of arrays which comprise, purely by way of example, a first array 399a and a second array 399b. In particular, in FIG. 5 the first and the second SPADs, designated once again by 1a and 1b, belong, respectively, to the first and second arrays 399a, 399b.

In greater detail, the packaging 152 encloses the array 300.

More in particular, the first packaging layer 160 overlies the SPADs of the first and second arrays 399a, 399. Further, the packaging 152 comprises, instead of the third packaging layer 163, a first external layer 165a and a second external layer 165b, which form a sort of pair of portions of an external coating region and are juxtaposed with respect to one another. The first and second external layers 165a, 165b are fixed to corresponding underlying portions of the first packaging layer 160. Further, to a first approximation, the first and second external layers 165a, 165b have one and the same thickness.

In yet greater detail, the first and second external layers 165a, 165b are made of materials such that: i) the first external layer 165a absorbs radiation having a wavelength lower than $\lambda_{filter1}$ and is to a first approximation transparent to radiation having a wavelength higher than $\lambda_{filter1}$; and ii) the second external layer 165b absorbs radiation having a wavelength lower than $\lambda_{filter2}$ and is to a first approximation transparent to radiation having a wavelength higher than $\lambda_{filter2}$, with $\lambda_{filter2} \neq \lambda_{filter1}$. In addition, the first and second external layers 165a, 165b have substantially the same refractive index as the first and second packaging layers 160, 162.

In practice, the array 300 is provided with two different detection capacities, in two different frequency bands, and may provide the same advantages described with reference to the array 99.

Figure 6:
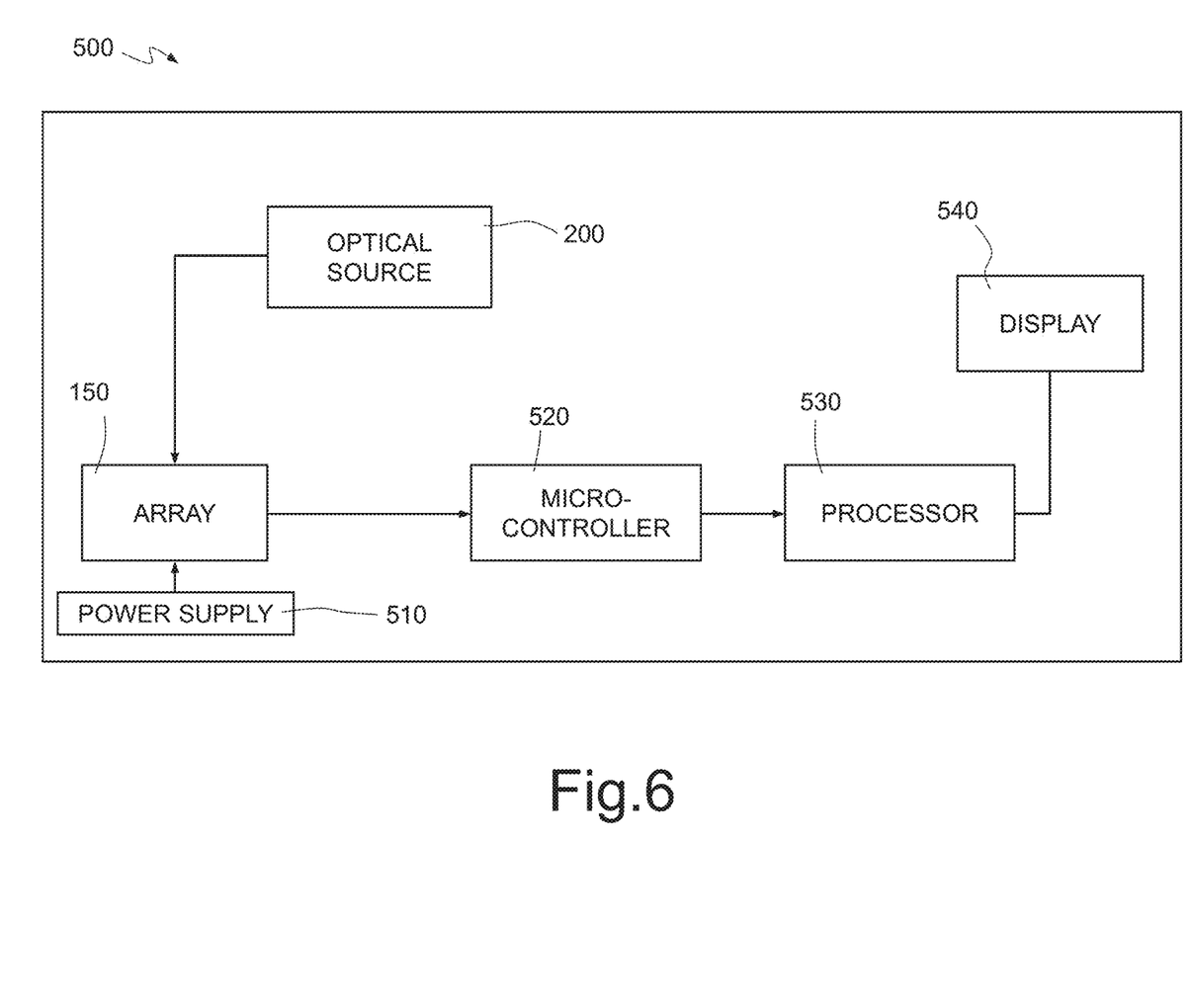
FIGS. 6 and 7 show block diagrams of systems that use an array of photodiodes.

The optoelectronic device 150, including the array 99 and/or the array 300, may be used in a generic detection system 500, shown in FIG. 6, in which the light source 200 illuminates the optoelectronic device 150, which is biased by a power supply 510 and is connected to a microcontroller unit 520, possibly by interposition of a pre-amplification stage (not shown). The microcontroller unit 520 processes the output signal of the optoelectronic device 150 and supplies a processed signal to a processor 530, which enables analysis of this processed signal and display of the information associated to this processed signal on a display 540. In a way in itself known and thus not shown, the microcontroller unit 520 may comprise an analog-to-digital converter and a microcontroller, arranged downstream of the analog-to-digital converter.

Figure 7:
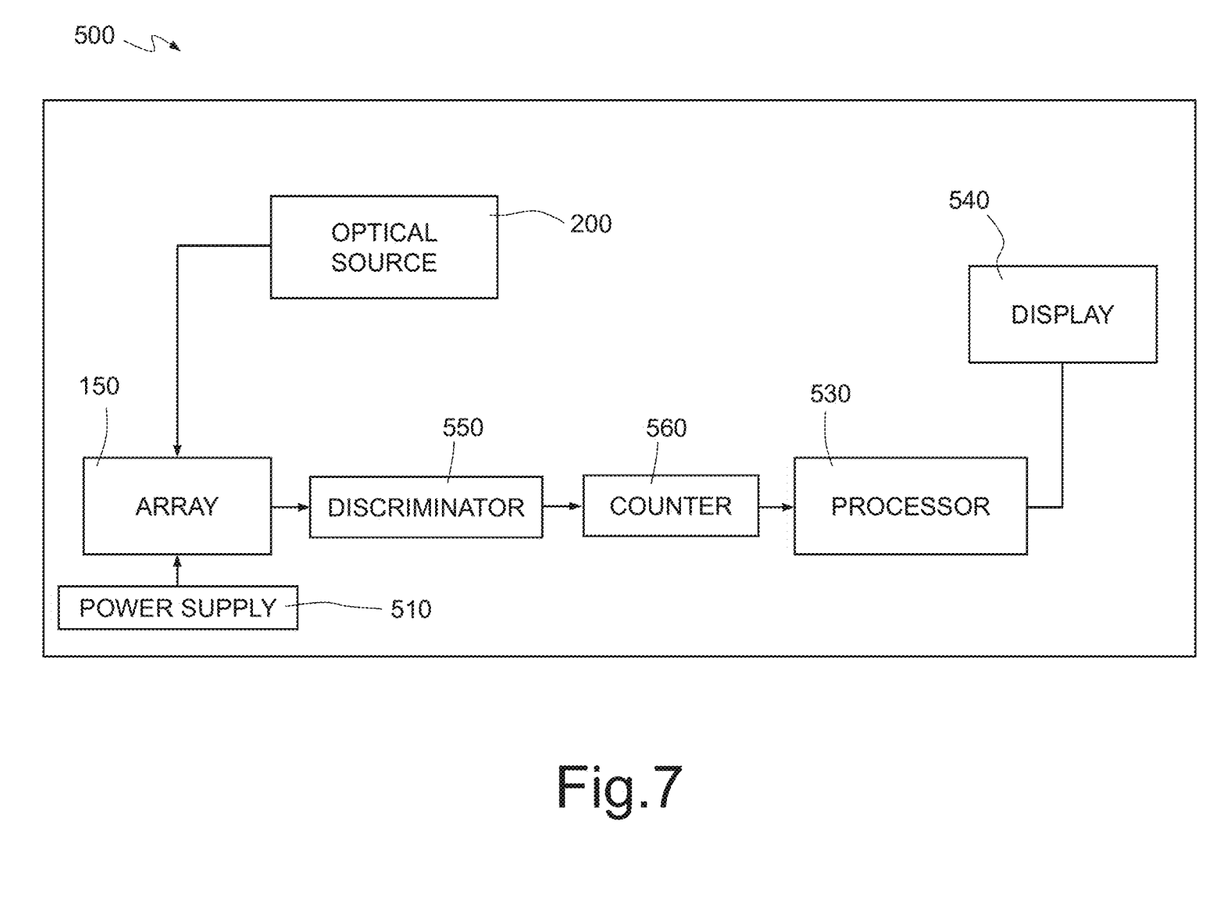

As shown in FIG. 7, instead of the microcontroller unit 520 there may be present: a discriminator 550, which receives the output signal of the optoelectronic device 150 and generates a pulse whenever said output signal exceeds a threshold, thus filtering the spurious events; and a counter 560, designed to increment a count at each pulse generated by the discriminator 550, the value of the count being communicated to the processor 530.

The advantages that the present array of SPADs affords emerge clearly from the foregoing discussion. In particular, the present array of SPADs is characterized by a higher signal-to-noise ratio (SNR) than avalanche detectors of infrared radiation. Further, the present array of SPADs may present a large sensitive area and may be biased for presenting high overvoltages, with consequent improvement of the gain and of the detection efficiency.

In addition, in the presence of luminous fluxes of low intensity, the present array of SPADs exhibits an extremely linear response, since just a few cells (i.e., SPADs) are turned on as a result of spurious crosstalk effects.

Finally, it is evident that modifications and variations may be made to the photodiode described, without thereby departing from the scope of the present disclosure.

For example, instead of silicon, there may be present a different semiconductor material (for instance, germanium, silicon-germanium, arsenic-gallium-indium, etc.). Further, the types of doping, P and N, may be reversed.

In general, given a semiconductor material that forms the semiconductor body 10 and the energy gap of which corresponds to a given wavelength $\lambda_{cutoff}$ that falls in the infrared region, the third packaging layer 164 is made of any material that: i) absorbs radiation having a wavelength $\lambda < \lambda_{filter} - \Delta$ and is transparent to radiation having a wavelength $\lambda > \lambda_{filter}$, with $\lambda_{cutoff} > \lambda_{filter}$; and ii) has refractive index with a real part that falls in the interval [$n_{inf}$, $n_{sup}$], in the wavelength range [$\lambda^*$, $\lambda_{cutoff}$], with $\lambda^* < \lambda_{filter} - \Delta$. As mentioned previously, in the interval [$\lambda^*$, $\lambda_{cutoff}$] the refractive indices of the first and second packaging layers 160, 162 have negligible imaginary parts, and real parts that fall in the interval [$n_{inf}$, $n_{sup}$].

Purely by way of example, in the case of germanium and of indium arsenide, we have, respectively, $\lambda_{cutoff} \approx 1850$ nm and $\lambda_{cutoff} \approx 3440$ nm. It is thus possible, for example, to make the semiconductor body of germanium and adopt a third packaging layer such that $\lambda_{filter} = 1400$ nm, for forming an array with excellent possibilities of application in the telecommunications field, where radiation having a wavelength of 1550 nm is frequently used. Other examples of materials that may be used to form the semiconductor body are: silicon and germanium alloys; arsenic and gallium alloys; indium, gallium, and arsenic alloys; phosphorus and indium alloys; and cadmium, mercury, and tellurium alloys.

Irrespective of the semiconductor material chosen, the structure of the semiconductor body 10 may be different from the one described, for example, as regards the number, arrangement, and characteristics of the epitaxial layers, in addition, as has already been said, to the semiconductor material that forms it.

More in general, the SPADs 1 of the array 99 may be different from what has been described.

For example, the anode region 12, instead of giving out onto the top surface $S_{sup}$, may be overlain by a top region of an N type. In this case, the first PN junction is at a greater depth than what has been described previously.

The guard ring 16 and/or the enriched region 14 may be absent, or in any case may have different characteristics from what has been described.

The lateral insulation region 24 may differ from what has been described, both as regards the geometry and as regards the structure and the materials. For example, the channel-stopper region 27 may include a plurality of dielectric layers. Once again purely by way of example, the barrier region 28 may be made of a material designed to reflect the secondary photons (for example, tungsten), or else absorb the secondary photons (for example, the aforementioned polysilicon, or else titanium nitride).

Possibly, the lateral insulation region 24 may be absent.

It is further possible for the SPAD 1 to be configured to implement quenching mechanisms different from the ones described. For example, each SPAD 1 may implement a corresponding integrated quenching resistor, of a vertical type, in which case the aforementioned polysilicon regions are absent.

In addition, the number, geometrical characteristics, and materials of the dielectric layers arranged over the top surface $S_{sup}$ may vary with respect to what has been described. For example, the second dielectric layer 32, or in any case the portion of second dielectric layer 32 that overlies the anode region 12 may be absent.

It is further possible for the second dielectric layer 32 (which, on the other hand, is optional) to have a refractive index different from the refractive index of the first, second, and third packaging layers 160, 162, 164, even though this may entail a degradation of the performance. It is further possible for there to be present, above the portion of second dielectric layer 32 that overlies the anode region 12, one or more additional layers (not shown), arranged between said portion and the first packaging layer 160. For example, the first packaging layer 160 may be arranged on a nitride layer (not shown), in direct contact therewith, this nitride layer being arranged over the second dielectric layer 32, with which it is in direct contact. In this case, the nitride layer and the second dielectric layer 32 may form an optimized anti-reflective structure for increase of transmission in the infrared.

The third absorption layer 164 may be constrained to the first absorption layer 160 in a way different from bonding, in which case the second packaging layer 162 may be absent. For example, the third packaging layer 164 may be formed by being poured in the liquid form over the first packaging layer 160, and then hardened. It is further possible for the third packaging layer 164 to be formed by a paint laid on the first absorption layer 160.

It is possible for the photodiodes to be such that the array 99 does not operate as SiPM. For example, instead of the cathode metallization 42, shared between the SPADs 1, a plurality of cathode metallizations may be present, each of which is associated to a corresponding SPAD 1.

Finally, it is possible for the array 99 to be packaged with a packaging different from SMD packaging.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An optoelectronic device, comprising:
a first array of Geiger-mode avalanche photodiodes configured to detect incoming photons and emit secondary photons in a first wavelength range and secondary photons having a wavelength that falls in a pass-band with a second wavelength range that is higher than the first wavelength range and between 700 nm and 1100 nm; and
a packaging structure that includes a first external dielectric structure formed by a first material configured to absorb the secondary photons in the first wavelength range and transmit the secondary photons in the second wavelength range.

2. The optoelectronic device according to claim 1, further comprising an internal dielectric structure positioned between the first array and the first external dielectric structure and formed by one or more second materials that substantially transmit radiation having a wavelength that falls in either of said first and second wavelength ranges.

3. The optoelectronic device according to claim 2, wherein said internal dielectric structure comprises a second layer that bonds the first layer and the first external dielectric structure together.

4. The optoelectronic device according to claim 1, further comprising a semiconductor body having a front surface, wherein the first array of Geiger-mode avalanche photodiodes includes a cathode region of a first type of conductivity formed in the semiconductor body and each photodiode comprises:
a respective anode region of a second type of conductivity, which extends within the cathode region;
a lateral insulation region extending through the body starting from the front surface and surrounding the respective anode region and a corresponding part of the cathode region, said lateral insulation region including a barrier region and an insulating region, which surrounds the barrier region, said barrier region being configured to absorb or reflect radiation.

5. The optoelectronic device according to claim 4, further comprising:
an internal dielectric structure positioned between the first array and the first external dielectric structure and formed by one or more second materials that substantially transmit radiation having a wavelength that falls in either of said first and second wavelength ranges; and
a passivation region, which extends over the front surface, in contact with the semiconductor body; wherein said internal dielectric structure extends in contact with said passivation region.

6. The optoelectronic device according to claim 1, further comprising
a semiconductor body having a front surface and a rear surface, wherein the first array of Geiger-mode avalanche photodiodes includes a cathode region of a first type of conductivity formed in the semiconductor body and each photodiode comprises a respective anode region of a second type of conductivity, which extends within the cathode region;
anode metallizations positioned on the front surface and electrically coupled to the anode regions, respectively, of the first array of Geiger-mode avalanche photodiodes; and
a cathode metallization positioned on the rear surface and electrically coupled to the cathode region.

7. The optoelectronic device according to claim 1, further comprising a conductive lead frame that includes one or more first pads that contact the cathode metallization and one or more second pads electrically coupled to the anode metallizations.

8. The optoelectronic device according to claim 1, wherein the first wavelength range is from 400 nm to 600 nm.

9. The optoelectronic device according to claim 1, further comprising:
a second array of Geiger-mode avalanche photodiodes; and
a second external dielectric region overlying said second array and made of a third material having a different pass-band than the first material.

10. The optoelectronic device according to claim 1, further comprising an internal dielectric structure positioned between the first array and the first external dielectric structure and formed by one or more second materials that substantially transmit radiation having a wavelength that falls in either of said first and second wavelength ranges, wherein said one or more second materials have refractive indices that fall in an interval having a width of 0.4; and said first external dielectric region has a refractive index with a real part that falls within said interval.

11. A photon-detection system comprising:
an optoelectronic device that includes:
a first array of Geiger-mode avalanche photodiodes configured to detect incoming photons and emit secondary photons in a first wavelength range between 400 nm and 600 nm and secondary photons having a wavelength that falls in a pass-band with a second wavelength range between 700 nm and 1100 nm; and
a packaging structure that includes a first external dielectric structure formed by a first material configured to absorb the secondary photons in the first wavelength range and transmit the secondary photons in the second wavelength range;
a light source optically coupled to the first array; and
a processing unit electrically coupled to the first array.

12. The photon-detection system according to claim 11, wherein said processing unit comprises a microcontroller unit, or else a discriminator and a counter electrically coupled together.

13. The photon-detection system according to claim 11, wherein:

said optoelectronic device comprises a semiconductor body having a front surface;

the first array of Geiger-mode avalanche photodiodes includes a cathode region of a first type of conductivity; and each photodiode comprises:
a respective anode region of a second type of conductivity, which extends within the cathode region;
a lateral insulation region extending through the body starting from the front surface and surrounding the respective anode region and a corresponding part of the cathode region, said lateral insulation region including a barrier region and an insulating region, which surrounds the barrier region, said barrier region being configured to absorb or reflect radiation.

14. The photon-detection system according to claim 11, wherein the optoelectronic device includes:
a second array of Geiger-mode avalanche photodiodes; and
a second external dielectric region overlying said second array and made of a third material having a different pass-band than the first material.

15. The photon-detection system according to claim 11, wherein the packaging structure includes an internal dielectric structure positioned between the first array and the first external dielectric structure and formed by one or more second materials that substantially transmit radiation having a wavelength that falls in either of said first and second wavelength ranges.

16. An optoelectronic device, comprising:
a first array of Geiger-mode avalanche photodiodes configured to detect incoming photons and emit secondary photons that have a wavelength in a first wavelength range between 400 nm and 600 nm and secondary photons that have a wavelength that falls in a pass-band with a second wavelength range that is higher than the first wavelength range;
a packaging structure that includes a first external dielectric structure formed by a first material that absorbs the secondary photons in the first wavelength range and transmits the secondary photons in the second wavelength range.

17. The optoelectronic device according to claim 16, further comprising an internal dielectric structure positioned between the first array and the first external dielectric structure and formed by one or more second materials that substantially transmit radiation having a wavelength that falls in either of said first and second wavelength ranges.

18. The optoelectronic device according to claim 16, comprising a semiconductor body having a front surface, wherein the first array of Geiger-mode avalanche photodiodes includes a cathode region of a first type of conductivity formed in the semiconductor body and each photodiode comprises:
a respective anode region of a second type of conductivity, which extends within the cathode region;
a lateral insulation region extending through the body starting from the front surface and surrounding the respective anode region and a corresponding part of the cathode region, said lateral insulation region including a barrier region and an insulating region, which surrounds the barrier region, said barrier region being configured to absorb or reflect radiation.

19. The optoelectronic device according to claim 18, comprising
an internal dielectric structure positioned between the first array and the first external dielectric structure and formed by one or more second materials that substantially transmit radiation having a wavelength that falls in either of said first and second wavelength ranges; and
a passivation region, which extends over the front surface, in contact with the semiconductor body; and wherein said internal dielectric structure extends in contact with said passivation region and said passivation region, first external dielectric region, and internal dielectric structure each have a refractive index that falls in an interval having a width of 0.4.

20. The optoelectronic device according to claim 16, further comprising:
a second array of Geiger-mode avalanche photodiodes; and
a second external dielectric region overlying said second array and made of a third material having a different pass-band than the first material.

* * * * *